United States Patent
Kim et al.

(10) Patent No.: US 8,656,258 B2
(45) Date of Patent: Feb. 18, 2014

(54) METHOD OF ENCODING AND DECODING MULTI-BIT LEVEL DATA

(75) Inventors: Yong June Kim, Seoul (KR); Jae Hong Kim, Seoul (KR); Kyoung Lae Cho, Yongin-si (KR); Jun Jin Kong, Yongin-si (KR); Ki Jun Lee, Seoul (KR); Ha Bong Chung, Seoul (KR); Keun Sung Choi, Goyang-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 703 days.

(21) Appl. No.: 12/429,718

(22) Filed: Apr. 24, 2009

(65) Prior Publication Data
US 2009/0276687 A1    Nov. 5, 2009

(30) Foreign Application Priority Data

Apr. 30, 2008 (KR) .................. 10-2008-0040877

(51) Int. Cl.
*G06F 11/00*  (2006.01)
(52) U.S. Cl.
USPC ........................................... 714/774
(58) Field of Classification Search
USPC .................................. 714/774, 777
See application file for complete search history.

(56) References Cited

U.S. PATENT DOCUMENTS

| | | | |
|---|---|---|---|
| 6,732,322 B1 | 5/2004 | Miyauchi et al. | |
| 6,735,725 B1* | 5/2004 | Wu et al. | 714/704 |
| 2002/0035710 A1 | 3/2002 | Miura et al. | |
| 2002/0154247 A1* | 10/2002 | Ghosh et al. | 348/614 |
| 2002/0172275 A1* | 11/2002 | Birru | 375/233 |
| 2009/0138781 A1* | 5/2009 | Huang | 714/756 |
| 2009/0150748 A1* | 6/2009 | Egner et al. | 714/758 |
| 2010/0020620 A1* | 1/2010 | Kim et al. | 365/185.24 |
| 2010/0241928 A1* | 9/2010 | Kim et al. | 714/763 |
| 2011/0016371 A1* | 1/2011 | Sakimura et al. | 714/763 |
| 2011/0296272 A1* | 12/2011 | Rub et al. | 714/755 |

FOREIGN PATENT DOCUMENTS

| | | | |
|---|---|---|---|
| JP | 11-212876 | 8/1999 | |
| JP | 11-317095 | 11/1999 | |
| JP | 2000-149592 | 5/2000 | |
| KR | 10-1999-0006688 | 1/1999 | |
| KR | 1020010005558 | 1/2001 | |
| WO | WO 2006/013529 | * 2/2006 | G11B 20/18 |

OTHER PUBLICATIONS

Meriam Webster Online dictionary: term "error" website: http://www.merriam-webster.com/dictionary/error.*

* cited by examiner

*Primary Examiner* — Yair Leibovich
(74) *Attorney, Agent, or Firm* — F. Chau & Associates, LLC

(57) ABSTRACT

A method of encoding multi-bit level data includes: determining a range of an error pattern generated according to a transmission symbol, encoding an M-bit level of a P-bit level corresponding to the transmission symbol based on the range of the error pattern, and excluding encoding of a P-M bit level of the P-bit level. The variable P is a natural number of a value at least two, and the variable M is a natural number less than P.

12 Claims, 14 Drawing Sheets

FIG. 4

| TRANSMISSION SYMBOL | RECEIVING SYMBOL | ERROR PATTERN |
|---|---|---|
| 0 | 0 | 0 |
| 1 | 1  2 | 0  +1 |
| 2 | 1  2  3 | −1  0  +1 |
| 3 | 1  2  3  4 | −2  −1  0  +1 |
| 4 | 2  3  4  5 | −2  −1  0  +1 |
| 5 | 3  4  5  6 | −2  −1  0  +1 |
| 6 | 4  5  6  7 | −2  −1  0  +1 |
| 7 | 5  6  7  8 | −2  −1  0  +1 |
| 8 | 6  7  8  9 | −2  −1  0  +1 |
| 9 | 7  8  9  10 | −2  −1  0  +1 |
| 10 | 8  9  10  11 | −2  −1  0  +1 |
| 11 | 9  10  11  12 | −2  −1  0  +1 |
| 12 | 10  11  12  13 | −2  −1  0  +1 |
| 13 | 11  12  13  14 | −2  −1  0  +1 |
| 14 | 12  13  14  15 | −2  −1  0  +1 |
| 15 | 13  14  15 | −2  −1  0 |

FIG. 8

| RECEIVING SYMBOL | TRANSMISSION CANDIDATE SYMBOL |
|---|---|
| 0 | 0 |
| 1 | 1 2 3 |
| 2 | 1 2 3 4 |
| 3 | 2 3 4 5 |
| 4 | 3 4 5 6 |
| 5 | 4 5 6 7 |
| 6 | 5 6 7 8 |
| 7 | 6 7 8 9 |
| 8 | 7 8 9 10 |
| 9 | 8 9 10 11 |
| 10 | 9 10 11 12 |
| 11 | 10 11 12 13 |
| 12 | 11 12 13 14 |
| 13 | 12 13 14 15 |
| 14 | 13 14 15 |
| 15 | 14 15 |

FIG. 9

|   | $\chi^{(1)}$ | | $\chi^{(2)}$ | |    |   | $\chi^{(1)}$ | | $\chi^{(2)}$ | | MT1 |
|---|---|---|---|---|---|---|---|---|---|---|---|
|   | $\chi_1$ | $\chi_2$ | $\chi_3$ | $\chi_4$ |   | $\chi_1$ | $\chi_2$ | $\chi_3$ | $\chi_4$ |
| 0 | 0 | 0 | 0 | 0 | 8  | 0 | 0 | 0 | 1 |
| 1 | 1 | 0 | 0 | 0 | 9  | 1 | 0 | 0 | 1 |
| 2 | 0 | 1 | 0 | 0 | 10 | 0 | 1 | 0 | 1 |
| 3 | 1 | 1 | 0 | 0 | 11 | 1 | 1 | 0 | 1 |
| 4 | 0 | 0 | 1 | 0 | 12 | 0 | 0 | 1 | 1 |
| 5 | 1 | 0 | 1 | 0 | 13 | 1 | 0 | 1 | 1 |
| 6 | 0 | 1 | 1 | 0 | 14 | 0 | 1 | 1 | 1 |
| 7 | 1 | 1 | 1 | 0 | 15 | 1 | 1 | 1 | 1 |

FIG. 10

|   | $\chi^{(1)}$ | | $\chi^{(2)}$ | |   | $\chi^{(1)}$ | | $\chi^{(2)}$ | |
|---|---|---|---|---|---|---|---|---|---|
|   | $\chi_1$ | $\chi_2$ | $\chi_3$ | $\chi_4$ |   | $\chi_1$ | $\chi_2$ | $\chi_3$ | $\chi_4$ |
| 0 | 0 | 0 | 0 | 0 | 8  | 0 | 0 | 1 | 1 |
| 1 | 1 | 0 | 0 | 0 | 9  | 1 | 0 | 1 | 1 |
| 2 | 1 | 1 | 0 | 0 | 10 | 1 | 1 | 1 | 1 |
| 3 | 0 | 1 | 0 | 0 | 11 | 0 | 1 | 1 | 1 |
| 4 | 0 | 0 | 1 | 0 | 12 | 0 | 0 | 0 | 1 |
| 5 | 1 | 0 | 1 | 0 | 13 | 1 | 0 | 0 | 1 |
| 6 | 1 | 1 | 1 | 0 | 14 | 1 | 1 | 0 | 1 |
| 7 | 1 | 1 | 1 | 0 | 15 | 0 | 1 | 0 | 1 |

MT3

METHOD OF ENCODING AND DECODING MULTI-BIT LEVEL DATA

CROSS-REFERENCE TO RELATED PATENT APPLICATION

This application claims priority to Korean Patent Application No. 10-2008-0040877, filed on Apr. 30, 2008, in the Korean Intellectual Property Office, the disclosure of which is incorporated by reference in its entirety herein.

BACKGROUND

1. Technical Field

Exemplary embodiments of the invention relate to encoding and decoding technologies, and more particularly to methods of encoding and decoding multi-bit level data.

2. Discussion of Related Art

An error-correcting code (ECC) or forward error correction (FEC) code is a code in which each data signal conforms to specific rules of construction such that departures from that construction in the received signal can be automatically detected and corrected. Error-correcting codes are used in computer data storage, for example in semiconductor memory devices, and in data transmission of communication systems. The error-correcting code may be encoded along with data (or symbols) to be sent to a receiving device. The encoded data may then be decoded by the receiving device to separate the data from the error-correcting code and the error-correcting code can be used to verify that the data was received without errors.

In a parity scheme, the encoded data may be a combination of parity bits and information bits and data errors may reduced by decoding of the encoded data. For example, in memory cells of multi-bit flash memory devices, data errors may be reduced by using data encoded with the error-correcting codes. However, use of parity bits reduces the number of bits that can be used to store information in each cell. This reduction in the number of information bits for each cell reduces the amount of information that may be stored in the flash memory device.

Thus, there is a need for methods of encoding data with error correction and decoding the data that increase the amount of information stored by the encoded data.

SUMMARY

According to an exemplary embodiment of the present invention, a method of encoding multi-bit level data includes: determining a range of an error pattern generated according to a transmission symbol, encoding an M-bit level of a P-bit level corresponding to the transmission symbol based on the range of the error pattern, and excluding encoding a (P-M) bit level of the P-bit level. The variables of P and M are natural numbers, P is at least two, and M is less than P.

The determining of the range of the error pattern may include: receiving the transmission symbol from a transmission terminal, and determining the range of the error pattern based on a table where the transmission symbol and the error pattern generated according to the transmission symbol are stored. The transmission terminal may be a host and each operation of the method may be performed in a data storage device. The data storage device may include at least one multilevel cell. Each operation of the method may be performed in a communication system.

The method may be performed when data is written to each of multilevel cells of a semiconductor memory device storing the P-bit level, wherein the excluding encoding of the (P-M) bit level may included in an operation in which the M-bit level of the P-bit level of each of the multilevel cells may be encoded.

The variable M may correspond to $[\log_2 L]$ where L is the total number of error patterns in the range of the error pattern. The variable M may be the smallest integer that is not less than a result of a calculation of $\log_2 L$.

The method may further include generating a mapping table for mapping each of a plurality of transmission symbols to a corresponding P-bit level before the determination. The mapping table may be used to map each decoded P-bit level to a corresponding transmission symbol.

The generating of the mapping table may include setting binary vectors of respective symbols in a same transmission candidate symbol set of the plurality of transmission symbols to be different from each other. The transmission candidate symbol set may be a set of all available transmission symbols with respect to a received symbol considering the error pattern. The binary vector may correspond to the encoded M-bit level of the plurality of multi-bit levels.

The setting of the binary vectors to be different from each other may include converting each of the binary vectors in the same transmission candidate symbol set to a gray code and setting the binary vectors to be different from each other.

The generating of the mapping table may further include minimizing a hamming distance of binary vectors between neighboring transmission symbols of the plurality of transmission symbols.

According to an exemplary embodiment of the present invention, a method of decoding multi-bit level data includes: detecting at least one transmission candidate symbol corresponding to a receiving symbol among a plurality of symbols, decoding an encoded M-bit level among a plurality of multi-bit levels corresponding to the receiving symbol, and selecting an original transmission symbol through decoded information of the encoded M-bit level of at least one of the transmission candidate symbols. The variable M is a natural number.

The detecting of at least one of transmission candidate symbols may include: receiving the receiving symbol from a transmission terminal, and detecting at least one of the transmission candidate symbols corresponding to the receiving symbol based on a table storing at least one transmission candidate symbol with respect to each of a plurality of receiving symbols. The transmission terminal may be a host and each operation of the method may be performed in a data storage device. The data storage device may be a semiconductor memory device. Each operation of the method may be performed in a communication system.

According to an exemplary embodiment of the present invention, a method of writing multi-bit level data to each of G-numbered cells includes: receiving parity bits and information bits to be written to each of the G-numbered cells, storing a corresponding one of the parity bits in the P-bit level of each of H-numbered cells of the G-numbered cells, and storing a corresponding one of the information bits in each P-bit level of each of (G-H) numbered cells if the G-numbered cells. The variables G, P, and H are natural numbers, H is less than G, and P is at least two.

The storing of the information bits may further include encoding an M-bit level of the P-bit level, and excluding encoding a (P-M) bit level of the P-bit levels of each of the (G-H) numbered cells. The variable M is a natural number less than P. A parity bit to decode the encoded M-bit level may be stored in the P-bit level of each of cells corresponding to the H-numbered cells.

BRIEF DESCRIPTION OF THE DRAWINGS

Exemplary embodiments of the present invention will be more clearly understood from the following detailed description taken in conjunction with the accompanying drawings in which:

FIG. 4 is a table for explaining an error pattern generated in the semiconductor memory device of FIG. 1;

FIG. 8 is a table showing transmission candidate symbols of receiving symbols received by the controller of FIG. 1;

FIG. 9 is a table of a bit to symbol mapping table stored in the controller of FIG. 1 according to an exemplary embodiment of the present invention;

FIG. 10 is a table of a bit to symbol mapping table stored in the controller of FIG. 1 according to an exemplary embodiment of the present invention;

DETAILED DESCRIPTION OF EXEMPLARY EMBODIMENTS

Figure 1:
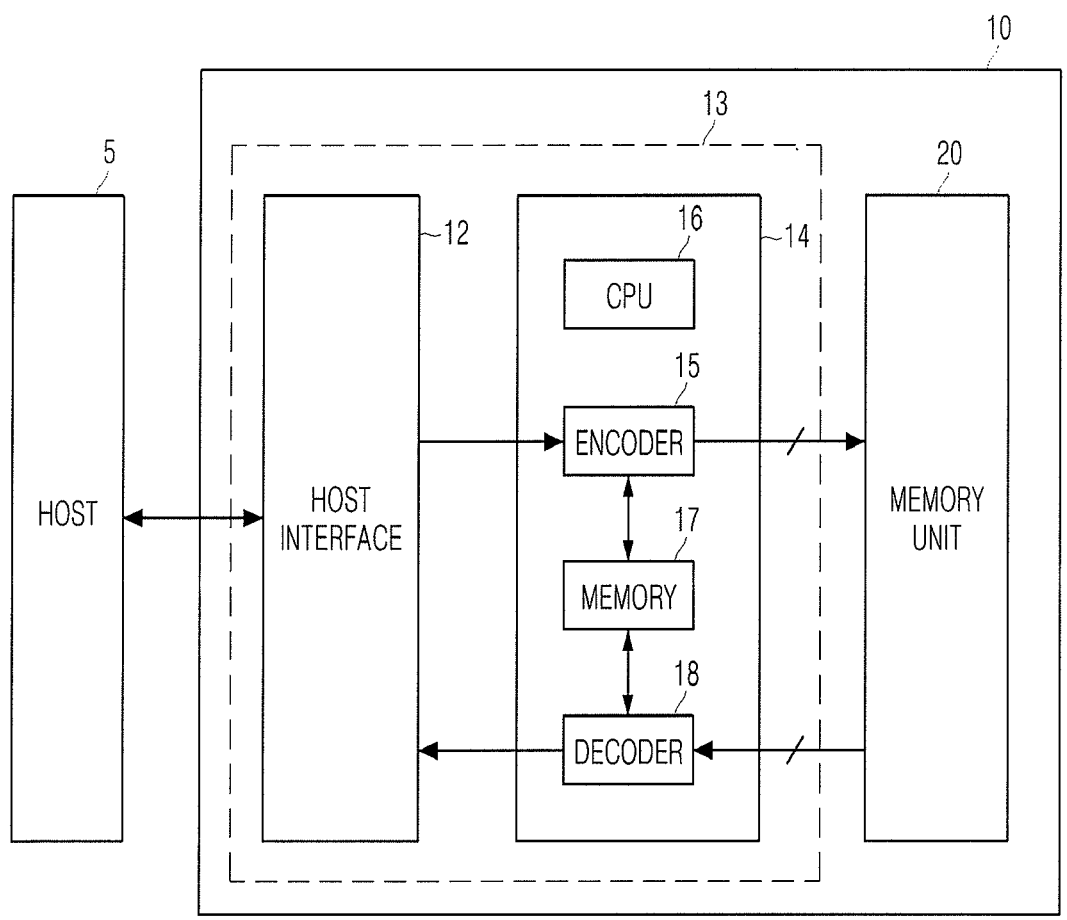
FIG. 1 is a block diagram of a semiconductor memory device according to an exemplary embodiment of the present invention.

Hereinafter, the present invention will be described in detail by explaining exemplary embodiments thereof with reference to the attached drawings. Like reference numerals in the drawings denote like elements.

Figure 2:
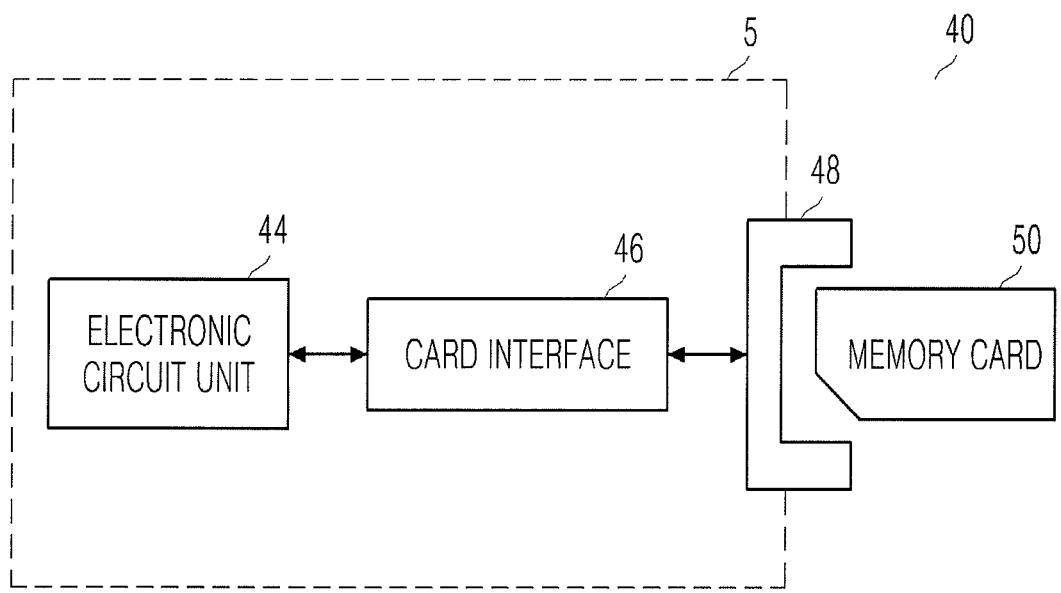
FIG. 2 is a block diagram of an electronic system according to an exemplary embodiment of the present invention including the semiconductor memory device of FIG. 1.

FIG. 1 is a block diagram of a semiconductor memory device according to an exemplary embodiment of the present invention. FIG. 2 is a block diagram of an electronic system according to an exemplary embodiment of the present invention including the semiconductor memory device of FIG. 1. FIGS. 3A-3J illustrate exemplary electronic devices having the electronic system of FIG. 2.

Figure 5:
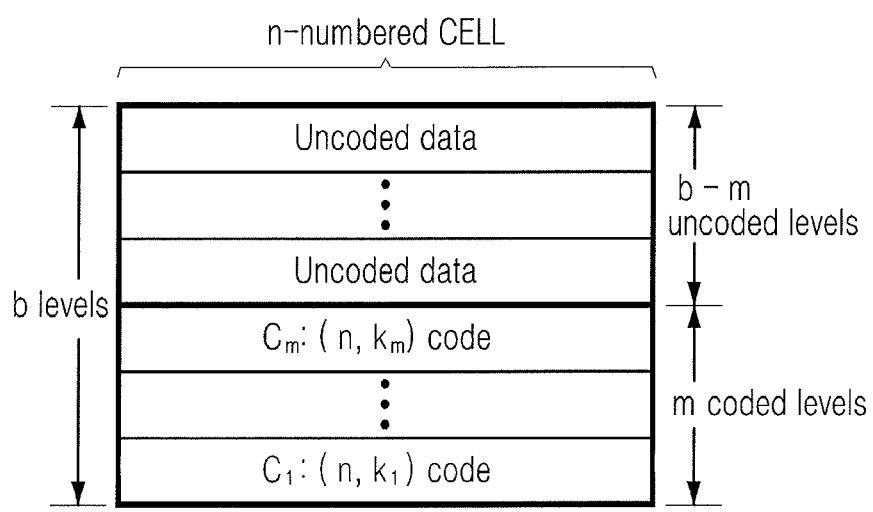
FIG. 5 illustrates a plurality of cells forming the memory unit of FIG. 1.
Figure 6:
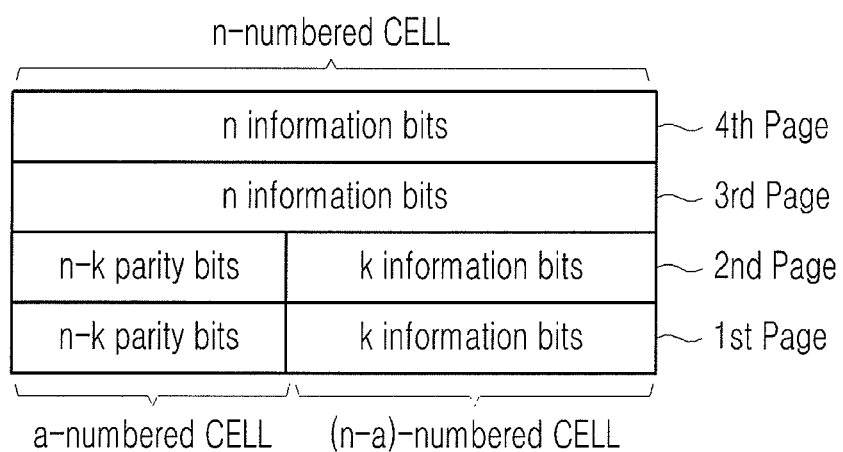
FIG. 6 illustrates a method of storing information data and parity data in the cells of FIG. 5 according to an exemplary embodiment of the present invention.
Figure 7:
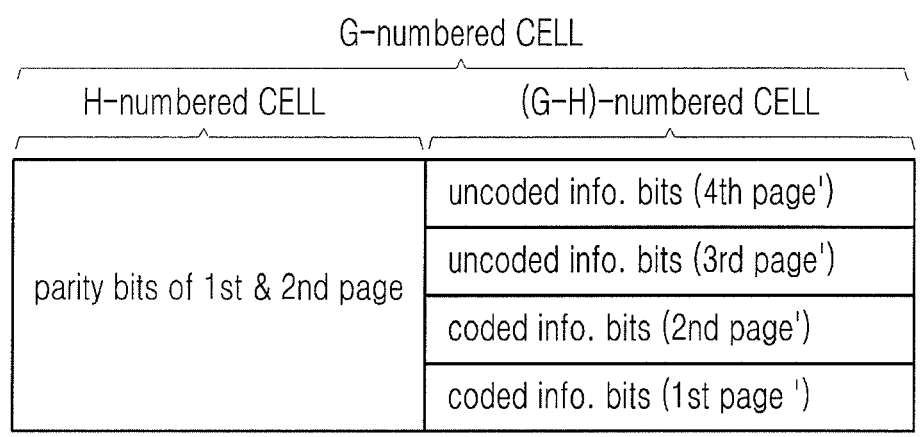
FIG. 7 illustrates a method of storing information data and parity data in the cells of FIG. 5 according to an exemplary embodiment of the present invention.

FIG. 4 is a table for explaining an error pattern generated in the semiconductor memory device of FIG. 1. FIG. 5 illustrates a plurality of cells forming a memory 20 unit of FIG. 1. FIGS. 6 and 7 each illustrate a method of storing information data and parity data in the cells of FIG. 5 according to an exemplary embodiment of the present invention.

FIG. 8 is a table showing transmission candidate symbols of receiving symbols received by a controller 13 of FIG. 1. FIGS. 9 and 10 are examples of bit to symbol mapping tables that may be stored in the controller 13 of FIG. 1 according to an exemplary embodiment of the present invention. Referring to FIGS. 1-10, a semiconductor memory device 10 may include a controller 13 and a memory unit 20. The semiconductor memory device 10 may be a memory card, for example, CompactFlash, Memory Stick, Memory Stick Duo, MultiMedia Card (MMC), Reduced-Size MMC (RS-MMC), Secure Digital (SD) Card, miniSD Card, microSD (TransFlash) Card, SmartMedia Card, or xD-Picture Card.

The semiconductor memory device 10 is electrically connected to a memory slot 48 of FIG. 2 to store data, for example, image data or audio data, output from an electronic circuit unit 44 via a card interface 46 included in a host 5, or transmit the stored data to the electronic circuit unit 44. For example, when the host 5 is a video camera of FIG. 3A, the electronic circuit unit 44 may include a CMOS image sensor (CIS), an image processor, and a digital signal processing unit to transmit the data, for example, image data or audio data, generated by the electronic circuit unit 44 to the semiconductor memory device 10 via the card interface 48.

Figure 3A:
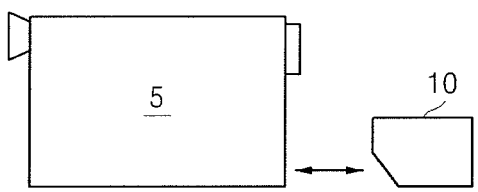
FIGS. 3A-3J illustrate electronic devices having the electronic system of FIG. 2.
Figure 3F:
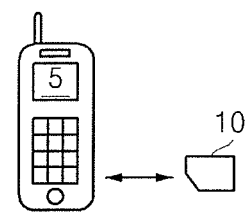
Figure 3B:
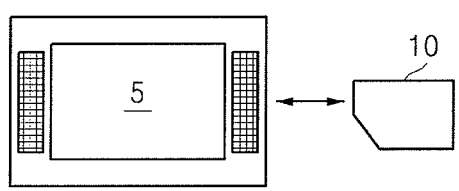
Figure 3G:
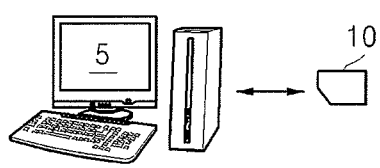
Figure 3C:
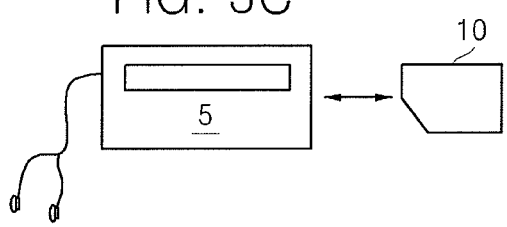
Figure 3H:
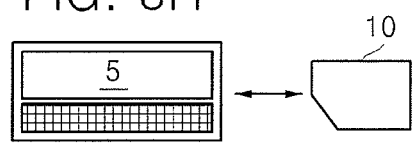
Figure 3D:
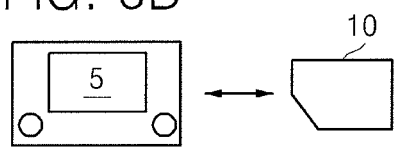
Figure 3I:
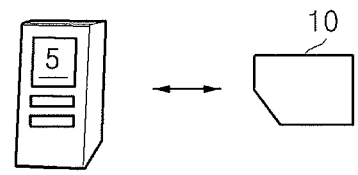
Figure 3E:
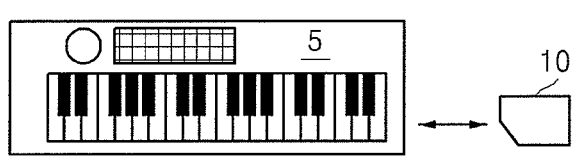
Figure 3J:
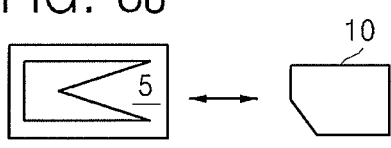

The semiconductor memory device 10 may be included in the video camera of FIG. 3A, a television of FIG. 3B, an MP3 player of FIG. 3C, a game console of FIG. 3D, an electronic musical instrument of FIG. 3E, a portable terminal of FIG. 3F, a personal computer (PC) of FIG. 3G, a personal digital assistant (PDA) of FIG. 3H, a voice recorder of FIG. 3I, or a PC card of FIG. 3J.

The controller 13 may encode at least one of multi-bit level data corresponding to a symbol or data received from the host 5, or store or write the encoded multi-bit level data in or to the memory unit 20. The controller 13 may decode the encoded multi-bit level data stored in the memory unit 20 and transmit a symbol corresponding to the encoded multi-bit level data to the host 5. The controller 13 may include a host interface 12 and an error correction code (ECC) block 14.

The host interface 12 may transmit a command and data output from the host 5 to the ECC block 14 and the data stored in the memory unit 20 to the host 5 via the ECC block 14. The ECC block 14 may encode at least one of the multi-bit level data corresponding to the symbol or data received from the host 5, store or write the encoded multi-bit level data in or to the memory unit 20, decode the encoded multi-bit level data stored in the memory unit 20, and transmit a symbol corresponding to the decoded multi-bit level data to the host 5.

The ECC block 14 may include an encoder 15, a CPU 16, a memory 17, and a decoder 18. The encoder 15 may encode at least one of the multi-bit level data corresponding to the symbol or data received from the host 5, and store or write the encoded multi-bit level data in or to the memory unit 20. The multi-bit level data includes bit levels or pages stored in each of the cells or multilevel cells of the memory unit 20, for example, a multi-bit flash memory. For a Q-decimal multi-bit flash memory, where "Q" is a natural number, for example, 16, the number of multi-bit levels of the multi-bit level data is B, where "B" is a natural number, for example 4.

To encode the multi-bit level data, the encoder 15 may detect the range or number of error patterns based on a transmission symbol received from the host 5 and a table storing the error patterns that may be generated according to the transmission symbol, and encode at least one of the multi-bit levels corresponding to the transmission symbol based on the range or number of the error patterns. The encoder 15 may encode at least one bit level using an ECC algorithm.

A channel of the memory unit 20, for example, a multi-bit flash memory, may generate an error pattern by incorrectly reading other neighboring symbols. For example, when the transmission symbol transmitted by the memory unit 20 is "3" (see FIG. 4), the controller 13 may receive either "3" or any one of "1", "2", and "4" as a receiving symbol. In this example, the error patterns that are values obtained by subtracting a value of the transmission symbol from a value of the receiving symbol are "−2", "−1", "0" and "1".

The transmission symbol generated by the memory unit 20 has an error pattern in a limited range or number. For example, FIG. 4 is a table showing error patterns of a receiving symbol according to the transmission symbol generated by the memory unit 20. When each of transmission symbols 0-15 is a Q-decimal symbol where "Q" is a natural number, for example, 16, the transmission symbol "0" has no error and the range or number of error patterns of the other symbols except for the transmission symbols "1", "2", and "15" is limited to four, that is, "−2", "−1", "0" and "1".

The encoder 15 may detect the range or number of error patterns referring to the table of FIG. 4 and encode at least one of the multi-bit levels corresponding to the transmission symbol based on the range or number of the error pattern. For example, the encoder 15 may encode only m-bit levels and exclude encoding (b-m)-bit levels of the b-multi-bit level data of each of the n-numbered cells or multilevel cells forming a codeword, as shown in FIG. 5.

When the range or number of error patterns is L, where "L" is a natural number, the encoder 15 may encode only m-bit levels of a plurality of multi-bit levels, where "m" is $[\log_2 L]$. The value "m" may also be the minimum integer not less than a calculation result of $\log_2 L$. For example, when the range or number of error patterns is four (e.g., "−2", "−1", "0" and "1"), the encoder 15 may encode only two bit levels, for example, the $1^{st}$ page and the $2^{nd}$ page, of the multi-bit levels, for example, the $1^{st}$ page through the $4^{th}$ page of FIG. 6. An average information bit number per cell (Kavg) may correspond to Equation 1 as follows:

$$K_{avg} = \sum_{i=1}^{m} \frac{Ki}{n} + (b-n).$$ [Equation 1]

In Equation 1, "Ki" denotes the information bit number of the $i^{th}$ bit level data where "i" is a natural number. A code rate per cell R may correspond to Equation 2 as follows:

$$R = Kavg/b.$$ [Equation 2]

The encoder 15 may encode only two bit levels (the $1^{st}$ page and the $2^{nd}$ page) of the four bit levels (the $1^{st}$ through the $4^{th}$ page) as shown in FIG. 6, when each of the transmission symbols 0-15 is a Q-decimal symbol, where "Q" is a natural number, for example, 16. A code rate per cell R' and an average information bit number per cell Kavg' may correspond respectively to Equations 3 and 4 as follows:

$$R' = (2n+2k)/4n = \{4k+2(n-k)\}/4 = k/n + (n-k)/2n,$$ [Equation 3]

$$Kavg' = 4R'.$$ [Equation 4]

For example, in the method of encoding the controller 13 according to the present exemplary embodiment, since only some of the bit levels are encoded, the average information bit number per cell may be increased.

A method of distributing cells to store information bits and parity bits that considers the encoded bit level and the un-encoded bit level will be discussed below. The method may include making the number of information bits of a bit level of an un-encoded portion and the number of information bits of a bit level of an encoded portion identical to or different from each other, for each bit level.

The number of wasted cells may be minimized by adjusting the numbers of information bits and parity bits for each bit level. The number of information bits of an un-encoded portion and the number of information bits of an encoded portion may be adjusted to be identical to each other.

For example, of a plurality of G-numbered cells where "G" is a natural number, each having the first through fourth bit levels (the first through fourth pages) as shown in FIG. 7, the encoder 15 may store information bits only in (G-H)-numbered cells, where "H" is a natural number smaller than "G", and parity bits of the $1^{st}$ and $2^{nd}$ pages only in H-numbered cells. The parity bits of the $1^{st}$ and $2^{nd}$ pages stored in the H-numbered cells may be used to decode the encoded information bits of each of the first bit level (the $1^{st}$ page') and the second bit level (the $2^{nd}$ page').

The cells of FIG. 7 have information bits of the same size for each page (or bit level) compared to the cells of FIG. 6. For example, since the first and second bit levels (the $1^{st}$ and $2^{nd}$ pages) of each of the a-numbered cells of FIG. 6 include parity bits, the number of cells for storing information is different for each bit level (e.g., each page). However, in the cells of FIG. 7, since the G-numbered cells of the memory unit 20 include only the parity bits of the $1^{st}$ and $2^{nd}$ pages needed to decode a particular bit level data, the number of cells to store information is identical for each bit level so that distributing cells to store information bits may be more easily controlled.

The CPU 16 may control the operations of the encoder 15, the memory 17, and the decoder 18. The CPU 16 may generate a mapping table MT1 for mapping each of the transmission symbols (0-16) to a corresponding multi-bit level and store the generated mapping table MT1 in the memory 17.

The mapping table MT1 is used for mapping each decoded multi-bit level to a corresponding transmission symbol as shown in FIG. 9. When a receiving symbol received from the mapping table MT1 is $S_i$, it is assumed that a transmission candidate symbol set with respect to the receiving symbol is $T(S_i)$. In this example, the transmission candidate symbol set $T(S_i)$ is a set of all available transmission symbols that may be received as the symbol $S_i$. When the receiving symbol received from the mapping table MT1 is $S_i$ and the transmission candidate symbol set with respect to the receiving symbol, for example, $S_i$ of FIG. 6, is $T(S_i)$, for example, FIG. 8, the receiving symbol $S_i$ may be expressed as a binary vector $(x_i = (x_{i,1}, x_{i,2}, \ldots, x_{i,b}) \in \{0,1\}^b)$ via a mapping between bit and symbol. In an exemplary embodiment of the binary vector $x_i$ of the mapping table MT1, the encoded binary vector is expressed as $x_i^{(1)} = (x_{i,1}, \ldots, x_{i,m}) \in \{0,1\}^m$ and the un-encoded binary vector is expressed as $x_i^{(2)} = (x_{i,m+1}, \ldots, x_{i,b}) \in \{0,1\}^{b-m}$.

The CPU 15 may set a particular binary vector of each symbol of the same transmission candidate symbol set of the transmission symbols (0-16), to be different from each other. For example, when the transmission candidate symbol set $T(S_i)$ is $T(s) = \{S_{i1}, S_{i2}, \ldots, S_{iM}\}$ and M≤L, the CPU 15 may set the encoded binary vector $x_{ij}^{(1)}$ of $S_{ij}$ and the encoded binary vector $x_{ik}^{(1)}$ of $S_{ik}$, to be different from each other, with respect to all j's and k's satisfying an inequality that $1 \le j \le k \le M$. For example, the CPU 15 may set particular binary vectors $x_1$ and $x_2$ for the transmission candidate symbol set, for example, "8", "9", "10", and "11" of FIG. 8, for the receiving symbol, for example, "9" of FIG. 8, respectively, to "00", "10", "01", and "11".

The CPU 15 may set the particular binary vectors to be different from each other by converting each of the particular binary vectors in the same transmission candidate symbol set to a gray code. For example, the CPU 15 converts each of the particular binary vectors $x_1$ and $x_2$ for the transmission candidate symbol set, for example, "8", "9", "10", and "11" of FIG. 8, for the receiving symbol, for example, "9" of FIG. 8, to a gray code, thus respectively set to "00", "10", "11", and "01", like the mapping table MT3 of FIG. 10.

The CPU 15 may minimize a hamming distance of the binary vectors between the neighboring transmission symbols of a plurality of transmission symbols. For example, the CPU 15 can convert each of the particular binary vectors $x_1$ and $x_2$ for the transmission candidate symbol set, for example, "8", "9", "10", and "11" of FIG. 8, for the receiving symbol, for example, "9" of FIG. 8, to a gray code, thus respectively set to "00", "10", "11", and "01", like the mapping table MT3 of FIG. 10.

The semiconductor memory device 10 according to at least one exemplary embodiment converts each particular binary vector in the same transmission candidate symbol set to a gray code and minimizes the hamming distance of binary vectors between the neighboring transmission symbols.

The memory 17 may store the table of FIG. 4 storing the error patterns, the table of FIG. 8 storing transmission candidate symbols for each receiving symbol, and the mapping table MT1 of FIG. 9 or mapping table MT3 of FIG. 10. The decoder 18 may decode the encoded multi-bit level data stored in the memory unit 20 and transmit a symbol corresponding to the decoded multi-bit level data to the host 5. The decoder 18 may perform decoding using a preset ECC algorithm.

The decoder 18 may detect at least one transmission candidate symbol corresponding to a receiving symbol of the transmission candidate symbols, during decoding of the receiving symbols received from the memory unit 20. For example, when the receiving symbol received from the memory unit 20 is 7, the decoder 18 may detect the transmission candidate symbols "6", "7", "8", and "9" from the table of FIG. 8 stored in the memory 17.

The decoder 18 may decode at least one encoded bit level of the multi-bit levels corresponding to the receiving symbol and detect a symbol including at least one decoded bit level of the transmission candidate symbols as a transmission symbol. For example, when the encoder 16 encodes only two bit levels, for example, the $1^{st}$ and $2^{nd}$ pages, of the multi-bit levels, for example, the $1^{st}$ through $4^{th}$ pages of FIG. 6, the decoder 18 may decode only the two bit levels (e.g., the $1^{st}$ and $2^{nd}$ pages).

The decoder 18 may detect a symbol including the two decoded bit levels x1 and x2 of the transmission candidate symbols "6", "7", "8", and "9" based on the mapping table MT1 of FIG. 9 as a transmission symbol. For example, decoder 18 may detect the symbol "6" as a transmission symbol when the decoded two bit levels "x1" and "x2" are respectively "0" and "1". For example, in the semiconductor memory device 10 according to at least one exemplary embodiment, since the encoding and decoding is performed only for a part of bit levels, for example, the $1^{st}$ and $2^{nd}$ pages, and not for the overall multi-bit levels, for example, the $1^{st}$ through $4^{th}$ pages, the average information bit number per cell may be increased.

When the CPU 16 is configured to use the mapping table MT3 of FIG. 10, decoding errors may be reduced. An exemplary result of decoding according to the mapping table MT1 or MT3 is shown below based on the assumption that a receiving symbol actually received by the decoder 18 is "8", while the transmission symbol stored in the memory unit 20 and transmitted to the decoder 18 is "6".

When the decoder 18 performs bit to symbol mapping using the mapping table MT1 of FIG. 9, a binary vector of the receiving symbol is "0110" and a binary vector of the transmission symbol is "0001". When an error is generated in the "x2" of the two decoded bit levels x1 and x2 so that $x^{(1)}=(x1, x2)=(0, 1)$, the finally decoded multi-bit level data is "0110", which is a 3-bit error.

However, when the decoder 18 performs bit to symbol mapping using the mapping table MT3 of FIG. 10, a binary vector of the receiving symbol is "1110" and a binary vector of the transmission symbol is "0011". When an error is generated in the "x2" of the two decoded bit levels x1 and x2 so that $x^{(1)}=(x1, x2)=(0, 1)$, the finally decoded multi-bit level data is "0110", which is a 2-bit error. For example, when the decoder 18 uses the mapping table MT3 of FIG. 10, an error generated when decoding fails may be reduced.

The memory unit 20 may store the multi-bit level data encoded by the ECC block 14. The memory unit 20 may be a non-volatile memory device, for example, a multi-bit flash memory device.

Figure 11:
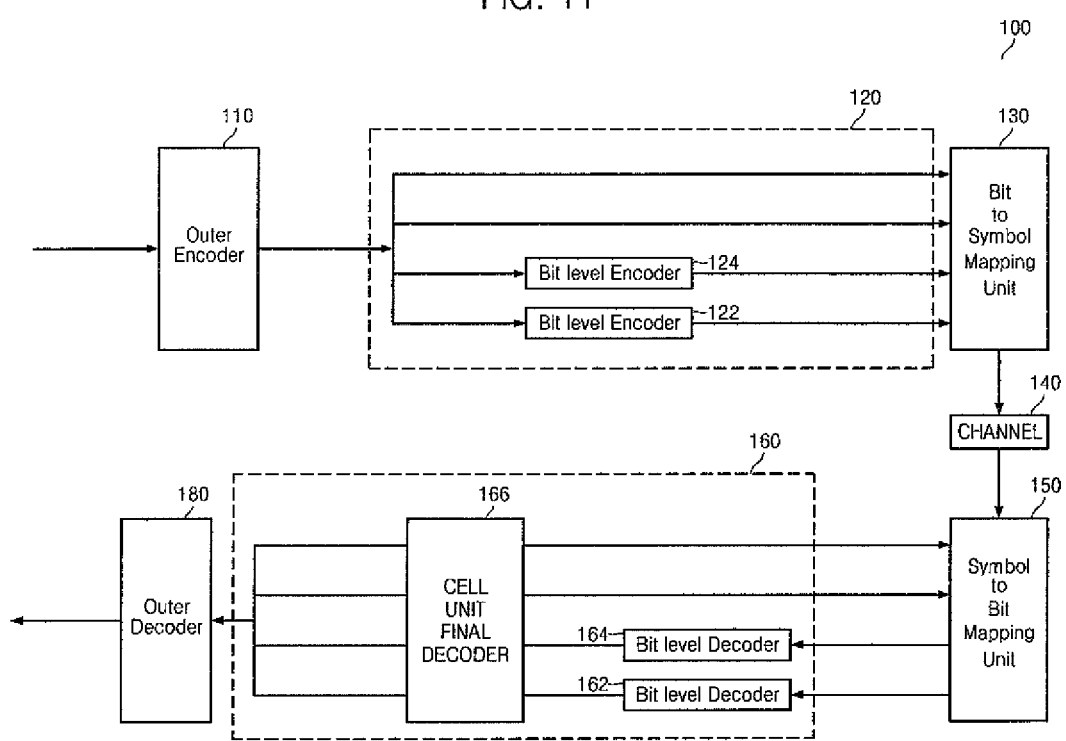
FIG. 11 is a block diagram of an encoding and decoding system according to an exemplary embodiment of the present inventive invention.

FIG. 11 is a block diagram of an encoding and decoding system according to an exemplary embodiment of the present invention. The encoding and decoding system may be implemented in a communication system or a semiconductor memory device. Referring to FIGS. 1 and 11, an encoding/decoding system 100 may include a first outer encoder 110, a first inner encoder 120, a bit to symbol mapping unit 130, a symbol to bit mapping unit 150, second inner decoder 160, and second outer decoder 180. The first outer encoder 110 may encode externally received data using an ECC algorithm. The inner encoder 120 may encode at least one bit level by classifying the encoded data to a plurality of multi-bit levels or data units based on the encoded data output from the outside encoder 110. For example, by using a first bit level encoder 122, the inner encoder 120 may encode the first bit level using the first ECC algorithm and output the encoded first bit level. By using a first bit level encoder 124, the inner encoder 120 may encode the second bit level using the second ECC algorithm and output the encoded second bit level. Further, the inner encoder 120 may output each of the third and fourth bit levels without encoding the third and fourth bit levels.

The bit to symbol mapping unit 130 may receive the encoded first bit level, the encoded second bit level, the third bit level (e.g., un-encoded), and the fourth bit level (e.g., un-encoded) from the inner encoder 120 and perform bit to symbol mapping in units of cells or symbols based on a received multi-bit level. The bit to symbol mapping unit 130 may transmit a result of the mapping to the channel 140, for example, a semiconductor memory device such as a multi-bit flash memory, or a communication channel.

The symbol to bit mapping unit 150 may receive a symbol via the channel 140 and perform symbol to bit mapping on the received symbol to output data corresponding to the first bit level, data corresponding to the second bit level, data corresponding to the third bit level, and data corresponding to the fourth bit level.

The inner decoder 160 may decode the data corresponding to the first bit level and the data corresponding to the second bit level, respectively using the first and second ECC algorithms. For example, by using a first bit level decoder 162, the inner decoder 160 may decode the data corresponding to the first bit level using the first ECC algorithm and output the decoded data. By using a second bit level decoder 164, the inner decoder 160 may decode the data corresponding to the second bit level using the second ECC algorithm and output the decoded data. The inner decoder 160 may output each of the data corresponding to the third bit level and the data corresponding to the fourth bit level, without encoding.

By using a cell unit final decoder 166, the inner decoder 160 may perform bit to symbol mapping in units of cells or symbols based on the data decoded using the first and second ECC algorithms, the data corresponding to the third bit level, and the date corresponding to the fourth bit level, and output decoded bit level data corresponding to the first, second, third, and fourth bit levels. For example, the cell unit final decoder 166 performs bit to symbol mapping in units of cells or channels based on the multi-bit level data received using the mapping table MT1 of FIG. 9 or the mapping table MT3 of FIG. 10 and outputs bit level data corresponding to the mapped symbol.

The outer decoder 180 may receive data corresponding to the bit level data output from the cell unit final decoder 166 and decode the received data to output the decoded data. The first and second ECC algorithms may be different from each other.

Figure 12:
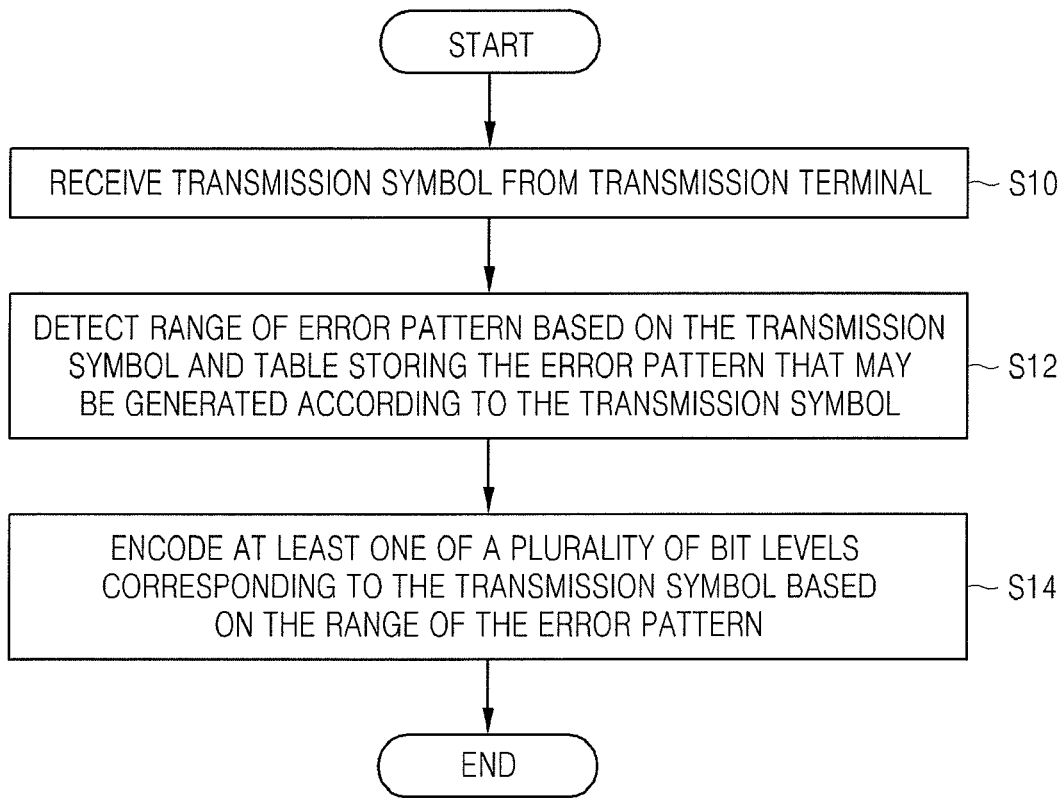
FIG. 12 is a flowchart for explaining a method of encoding multi-bit level data according to an exemplary embodiment of the present invention.

FIG. 12 is a flowchart for explaining a method of encoding multi-bit level data according to an exemplary embodiment of the present invention. Referring to FIGS. 1 and 12, the controller 13 receives a transmission symbol from a transmission terminal, for example, the host 5, (S10). The controller 13 detects a range of an error pattern based on a table, for example, the table of FIG. 4, storing a transmission symbol and the error pattern that may be generated according to the transmission symbol (S12). The controller 13 may encode at least one bit level of the multi-bit levels corresponding to the transmission symbol based on the range of error pattern (S14).

Figure 13:
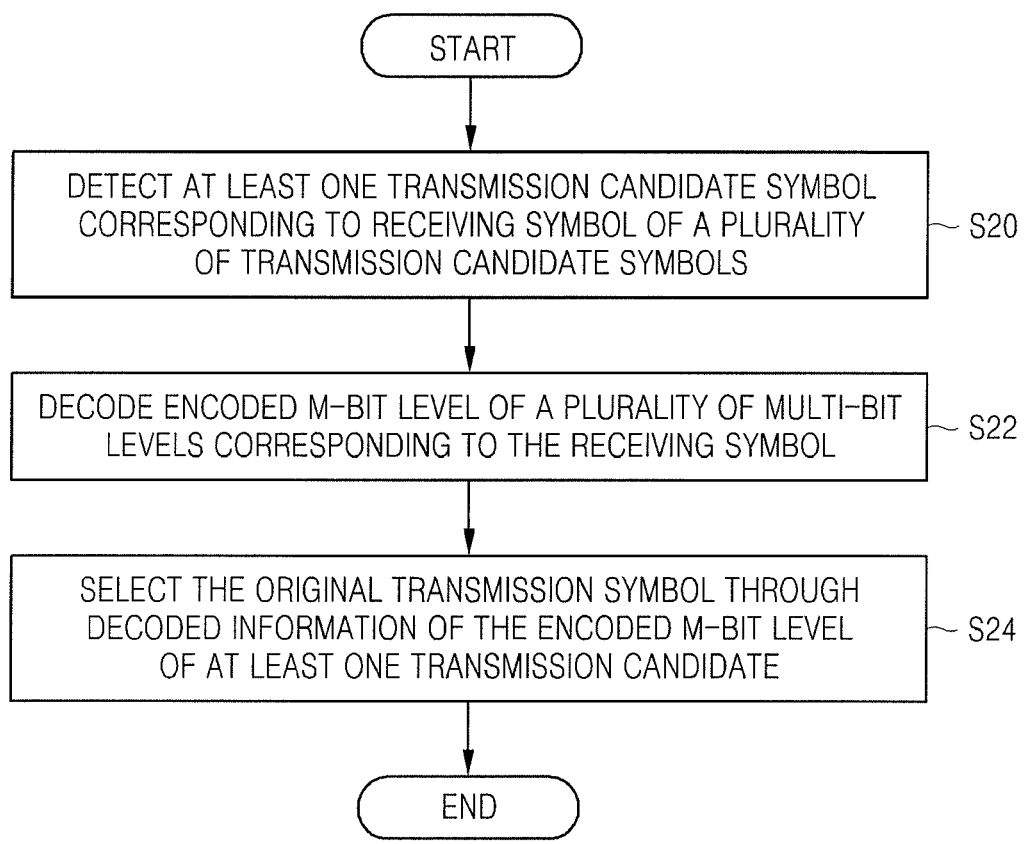
FIG. 13 is a flowchart for explaining a method of decoding multi-bit level data according to an exemplary embodiment of the present invention.

FIG. 13 is a flowchart for explaining a method of decoding multi-bit level data according to an exemplary embodiment of the present invention. Referring to FIGS. 1 and 13, the controller 13 detects at least one transmission candidate symbol corresponding to a receiving symbol among the transmission candidate symbols (S20). For example, the controller 13 detects at least one transmission candidate symbol corresponding to the receiving symbol based on the table of FIG. 8 and stores at least one transmission candidate symbol with respect to each of the receiving symbols. The controller 13 decodes at least one encoded bit level of the multi-bit levels of each of at least one transmission candidate (S22). The controller 13 detects a symbol including at least one decoded bit level of the multi-bit level of each of at least one transmission candidate, as a transmission symbol (S24). For example, the controller 13 detects a symbol including at least one decoded bit level of the multi-bit level of each of at least one transmission candidate, as a transmission symbol, based on the mapping table MT1 of FIG. 9 or the mapping table MT3 of FIG. 10.

Figure 14:
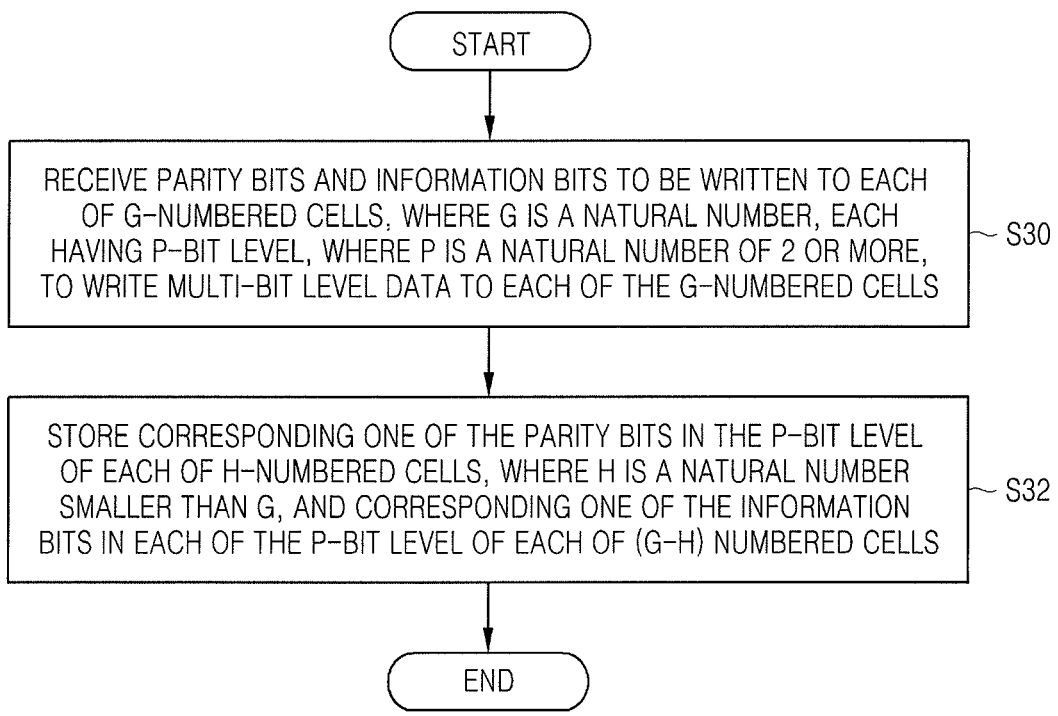
FIG. 14 is a flowchart for explaining a method of writing multi-bit level data according to an exemplary embodiment of the present invention.

FIG. 14 is a flowchart for explaining a method of writing multi-bit level data according to an exemplary embodiment of the present invention. Referring to FIGS. 1 and 14, the ECC block 14 receives parity bits and information bits to write to each of the G-numbered cells, where "G" is a natural number, each having a P bit levels, where "P" is a natural number of 2 or more, to write multi-bit level data to each of the G-numbered cells (S30).

The ECC block 14 stores a corresponding one of the parity bits in the P-bit level of each of the H-numbered cells, where "H" is a natural number smaller than G, and a corresponding one of the information bits in each of the P-bit levels of each of the (G-H) numbered cells (S32).

As described above, according to a method of encoding and decoding multi-bit level data according to at least embodiment of the present invention, since only some multi-bit levels are encoded, the average of the information bits for each cell may be increased. Further, bit errors may be reduced even when decoding fails, by using a bit to symbol mapping table employing a gray code or a bit to symbol mapping table that minimizes a hamming distance of binary vectors between the neighboring symbols. In addition, according to a method of writing multi-bit level data according to at least one exemplary embodiment of the present invention, information bits and parity bits are stored considering the encoded bit level and the un-encoded bit level so that cells may be more effectively distributed.

While the present invention has been described with reference to exemplary embodiments thereof, it will be understood that various changes in form and details may be made therein without departing from the spirit and scope of the disclosure.

What is claimed is:

1. A method of encoding data, the method comprising:
receiving a transmission symbol from a transmission terminal;
referring to a table that comprises entries of possible transmission symbols and their respective possible error patterns;
determining a total count L of a number of error patterns from the entry pertaining to the received transmission symbol;
determining a value M from L;
encoding M pages of P pages in a cell of a data storage device and excluding encoding of the remaining pages;
wherein a page comprises multiple information bits, M and P are natural numbers, P is at least two, and M is less than P and at least one,
wherein the error patterns are numerical offsets from a value of the transmission symbol.

2. The method of claim 1, wherein the transmission terminal is a host and each operation of the method is performed in the data storage device.

3. The method of claim 1, wherein each operation of the method is performed in a communication system.

4. The method of claim 1, being performed when data is written to each cell of a semiconductor memory device storing the P pages.

5. The method of claim 1, wherein M corresponds to $[\log_2 L]$.

6. The method of claim 1, further comprising generating a mapping table for mapping each of a plurality of transmission symbols to a corresponding one of the P pages before the determination, wherein the mapping table is used to map each decoded P page to a corresponding transmission symbol.

7. The method of claim 6,
wherein the generating of the mapping table comprises setting binary vectors of respective symbols in a same transmission candidate symbol set of the plurality of transmission symbols to be different from each other,
wherein the transmission candidate symbol set is a set of all available transmission symbols with respect to a received symbol considering the error pattern.

8. The method of claim 7, wherein the binary vectors correspond to the encoded M pages of the P pages.

9. The method of claim 7, wherein the setting of the binary vectors to be different from each other comprises converting each of the binary vectors in the same transmission candidate symbol set to a gray code and setting the binary vectors to be different from each other.

10. The method of claim 7, wherein the generating of the mapping table further comprises minimizing a hamming distance of binary vectors between neighboring transmission symbols of the plurality of transmission symbols.

11. A method of encoding data, the method comprising:

receiving a transmission symbol from a transmission terminal;

determining a total count of a number of error patterns associated with the transmission symbol; and encoding M pages of P pages in a cell of a data storage device and excluding encoding of the remaining pages based on the total count, wherein M and P are natural numbers, P is at least two, and M is less than P, wherein the method further comprises:

generating a mapping table for mapping each of a plurality of transmission symbols to a corresponding one of the P pages before the determination, wherein the mapping table is used to map each decoded P page to a corresponding transmission symbol, wherein the generating of the mapping table comprises setting binary vectors of respective symbols in a same transmission candidate symbol set of the plurality of transmission symbols to be different from each other, and wherein the transmission candidate symbol set is a set of all available transmission symbols with respect to a received symbol considering the error pattern.

12. A method of decoding multi-bit level data, the method comprising:

receiving an encoded symbol from a transmission channel;

mapping the encoded symbol to cells of data storage;

decoding only M encoded pages of P pages of the cell of a data storage corresponding to the receiving symbol to generate decoded information, using a bit level decoder;

decoding the decoded information using a cell unit final decoder by referring to a table that comprises entries of receiving symbols and their respective candidate bit mappings; and outputting by the final decoder, bit level data corresponding to the mapped symbol, to an outer decoder;

wherein M and P are a natural numbers, P is at least 2, and M is less than P and at least one.

* * * * *